(12) United States Patent
Wang et al.

(10) Patent No.: US 11,243,473 B2
(45) Date of Patent: Feb. 8, 2022

(54) MEASUREMENT METHOD AND APPARATUS

(71) Applicant: ASML NETHERLANDS B.V., Veldhoven (NL)

(72) Inventors: Te-Sheng Wang, San Jose, CA (US); Qian Zhao, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/615,207

(22) PCT Filed: May 28, 2018

(86) PCT No.: PCT/EP2018/063948
§ 371 (c)(1),
(2) Date: Nov. 20, 2019

(87) PCT Pub. No.: WO2018/224349
PCT Pub. Date: Dec. 13, 2018

(65) Prior Publication Data
US 2020/0159124 A1    May 21, 2020

Related U.S. Application Data

(60) Provisional application No. 62/515,921, filed on Jun. 6, 2017.

(51) Int. Cl.
*G03F 7/20* (2006.01)
*G03F 1/86* (2012.01)

(52) U.S. Cl.
CPC ............... *G03F 7/705* (2013.01); *G03F 1/86* (2013.01); *G03F 7/70433* (2013.01); *G03F 7/70516* (2013.01); *G03F 7/70616* (2013.01)

(58) Field of Classification Search
USPC .......................................................... 716/51
See application file for complete search history.

(56) References Cited

U.S. PATENT DOCUMENTS

| 5,991,006 A | 11/1999 | Tsudaka |
|---|---|---|
| 6,014,456 A | 1/2000 | Tsudaka |
| (Continued) | | |

FOREIGN PATENT DOCUMENTS

| CN | H0934095 | 2/1997 |
|---|---|---|
| CN | 1683998 | 10/2005 |
| (Continued) | | |

OTHER PUBLICATIONS

International Search Report and Written Opinion issued in corresponding PCT Patent Application No. PCT/EP2018/063948, dated Sep. 26, 2018.

(Continued)

*Primary Examiner* — Bryce M Aisaka
(74) *Attorney, Agent, or Firm* — Pillsbury Winthrop Shaw Pittman LLP

(57) ABSTRACT

A method involving obtaining a simulation of a contour of a pattern to be formed on a substrate using a patterning process, determining a location of an evaluation point on the simulated contour of the pattern, the location spatially associated with a location of a corresponding evaluation point on a design layout for the pattern, and producing electronic information corresponding to a spatial bearing between the location of the evaluation point on the simulated contour and the location of the corresponding evaluation point on the design layout, wherein the information corresponding to the spatial bearing is configured for determining a location of an evaluation point on a measured image of at least part of the pattern, the evaluation point on the measured (Continued)

image spatially associated with the corresponding evaluation point on the design layout.

20 Claims, 9 Drawing Sheets

(56) References Cited

U.S. PATENT DOCUMENTS

| | | | |
|---|---|---|---|
| 7,587,704 | B2 | 9/2009 | Ye et al. |
| 8,578,303 | B1 | 11/2013 | Tsai et al. |
| 2005/0179886 | A1 | 8/2005 | Shi et al. |
| 2006/0250589 | A1 | 11/2006 | Eurlings et al. |
| 2007/0061773 | A1* | 3/2007 | Ye .................. G06F 30/398 |
| | | | 716/52 |
| 2009/0157360 | A1 | 6/2009 | Ye et al. |
| 2010/0010784 | A1 | 1/2010 | Cao et al. |
| 2011/0139027 | A1 | 6/2011 | Hansen |
| 2011/0202898 | A1 | 8/2011 | Kusnadi et al. |
| 2019/0025705 | A1* | 1/2019 | Van Derlaan ....... G03F 7/70616 |

FOREIGN PATENT DOCUMENTS

| | | |
|---|---|---|
| CN | 1892443 | 1/2007 |
| CN | 102057329 | 5/2011 |
| CN | 102096331 | 6/2011 |
| JP | 2008242112 | 10/2008 |

OTHER PUBLICATIONS

Chinese Office Action issued in corresponding Chinese Patent Application No. 201880037363.9, dated Mar. 9, 2021.
Korean Office Action issued in corresponding Korean Patent Application No. 10-2020-7000201, dated Jan. 25, 2021.

* cited by examiner

MEASUREMENT METHOD AND APPARATUS

CROSS-REFERENCE TO RELATED APPLICATIONS

This application is the U.S. national phase entry of PCT Patent Application No. PCT/EP2018/063948, filed on May 28, 2018, which claims the benefit of priority of U.S. Patent Application No. 62/515,921 which was filed on Jun. 6, 2017 and which is incorporated herein in its entirety by reference.

FIELD

The present description relates to methods of, and apparatuses for, measurement.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

Metrology processes are used at various steps during a patterning process to monitor and control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), the measurements of the one or more characteristics may be used to alter one or more parameters of the patterning process such that further substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Errors, such as overlay errors, CD errors, etc., will inevitably be produced in the patterning process. For example, imaging errors may be produced from optical aberration, patterning device heating, patterning device errors, and/or substrate heating and can be characterized in terms of, e.g., overlay errors, CD errors, etc. Additionally or alternatively, errors may be introduced in other parts of the patterning process, such as in etch, development, bake, etc. and similarly can be characterized in terms of, e.g., overlay errors, CD errors, etc. The errors may directly cause a problem in terms of the function of the device, including failure of the device to function or one or more electrical problems of the functioning device.

As noted above, in patterning processes, it is desirable to frequently make measurements of the structures created, e.g., for process control and verification. One or more parameters of the structures are typically measured or determined, for example the critical dimension of a structure, the overlay error between successive layers formed in or on the substrate, etc. There are various techniques for making measurements of the microscopic structures formed in a patterning process. Various tools for making such measurements are known including, but not limited to, scanning electron microscopes (SEMs), which are often used to measure critical dimension (CD). SEMs have high resolving power and are capable of resolving features of the order of 30 nm or less, 20 nm or less, 10 nm or less, or 5 nm or less. SEM images of semiconductor devices are often used in the semiconductor fab to observe what is happening at the device level.

The measurement information (such as extracted from SEM images of device structures) can be used for process modeling, existing model calibration (including recalibration), defect detection, estimation, characterization or classification, yield estimation, process control or monitoring, etc.

In an embodiment, there is provided a method comprising: obtaining a simulation of a contour of a pattern to be formed on a substrate using a patterning process; determining, by a hardware computer system, a location of an evaluation point on the simulated contour of the pattern, the location spatially associated with a location of a corresponding evaluation point on a design layout for the pattern; and producing, by the hardware computer system, electronic information corresponding to a spatial bearing between the location of the evaluation point on the simulated contour and the location of the corresponding evaluation point on the design layout, wherein the information corresponding to the spatial bearing is configured for determining a location of an evaluation point on a measured image of at least part of the pattern, the evaluation point on the measured image spatially associated with the corresponding evaluation point on the design layout.

In an embodiment, there is provided a method comprising: obtaining electronic information corresponding to a spatial bearing between a location of an evaluation point on a simulated contour of a pattern to be formed on a substrate using a patterning process and a location of a corresponding evaluation point on a design layout for the pattern; obtaining a measured image of at least part of the pattern; determining, by a hardware computer system and based on the spatial bearing information, a location of an evaluation point on the measured image of the at least part of the pattern, the evaluation point on the measured image spatially associated with the corresponding evaluation point on the design layout; and outputting spatial parameter information based on the determined location.

In an aspect, there is provided a method of manufacturing devices wherein a device pattern is applied to a series of substrates using a patterning process, the method including evaluating a patterned structure formed using the patterning process using a method described herein and controlling the patterning process for one or more of the substrates in accordance with the result of the method. In an embodiment, the patterned structure is formed on at least one of the substrates and the method comprises controlling the patterning process for later substrates in accordance with the result of the method.

In aspect, there is provided a non-transitory computer program product comprising machine-readable instructions configured to cause a processor to cause performance of a method described herein.

In an aspect, there is provided an inspection system. The system includes an inspection apparatus as described herein; and an analysis engine comprising a non-transitory computer program product as described herein. In an embodiment, the inspection apparatus comprises an electron beam inspection apparatus. In an embodiment, the system further comprises a lithographic apparatus comprising a support structure configured to hold a patterning device to modulate a radiation beam and a projection optical system arranged to project the modulated radiation beam onto a radiation-sensitive substrate.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
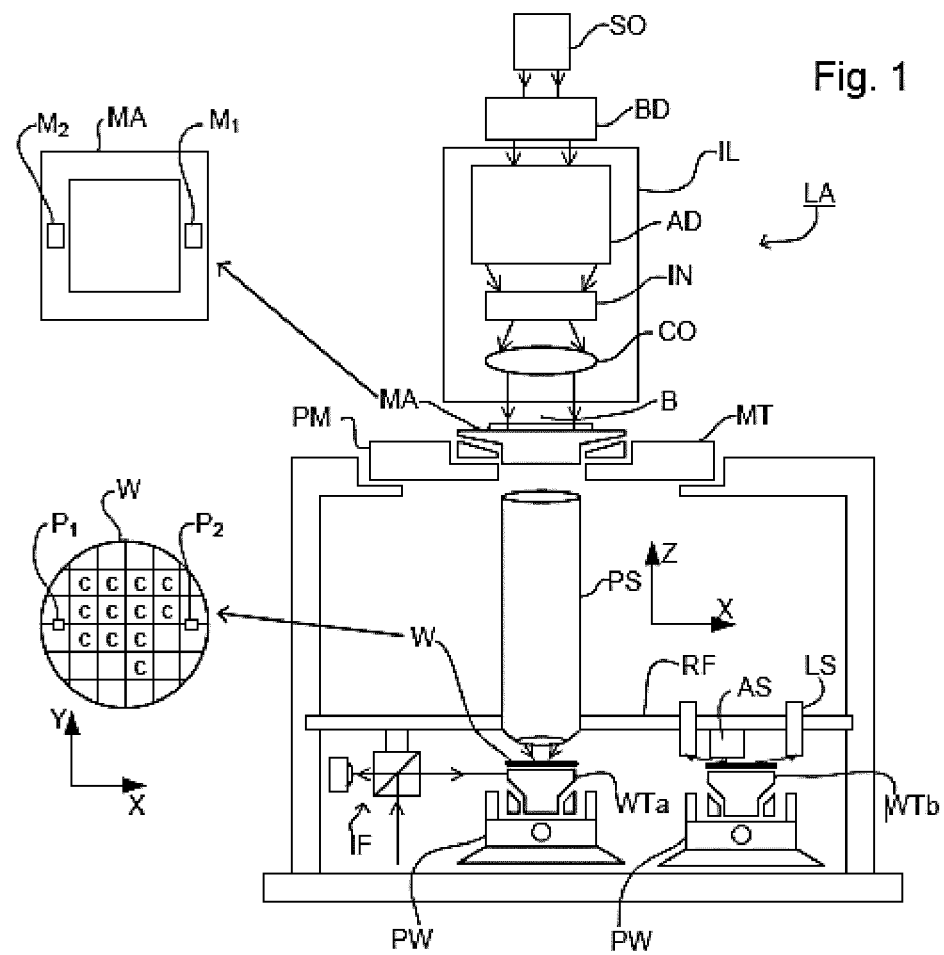
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for pattern transfer.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different patterning or other process conditions than adjacent features. An embodiment of an alignment system, which detects the alignment markers, is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
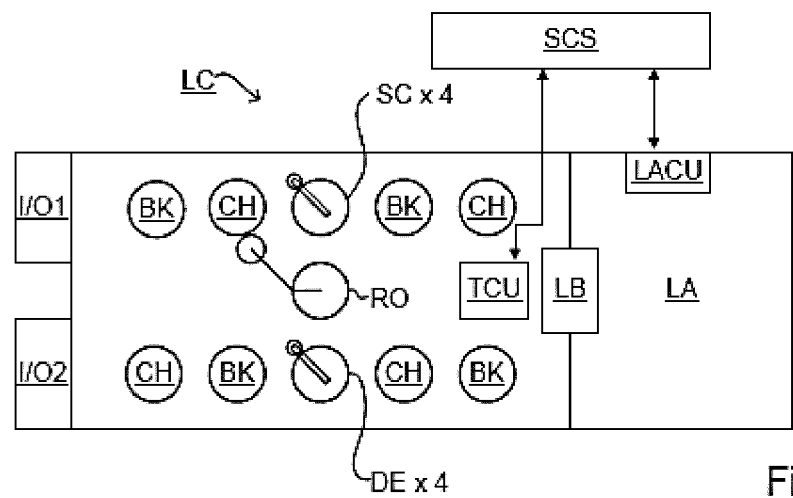
FIG. 2 schematically depicts an embodiment of a lithographic cell or cluster.

As shown in FIG. 2, a lithographic apparatus LA may form part of a lithographic cell LC, also sometimes referred to as a lithocell or lithocluster, which also includes apparatus to perform one or more pre- and post-pattern transfer processes on a substrate. Conventionally these include one or more spin coaters SC to deposit a resist layer, one or more developers DE to develop patterned resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

To enable that the substrate that is processed (e.g., exposed) by the patterning process is processed correctly and consistently, it is desirable to inspect a processed substrate to measure one or more properties such as overlay error between subsequent layers, line thickness, critical dimension (CD), etc. If an error is detected, an adjustment may be made to the patterning process, e.g., in terms of changing a design of, or changing a tool for designing, the patterning process, controlling an executing patterning process, etc.

An inspection apparatus can be used for such measurement. An inspection apparatus is used to determine one or more properties of a substrate, and in particular, how one or more properties of different substrates or different layers of the same substrate vary from layer to layer and/or across a substrate and/or across different substrates, e.g., from substrate to substrate. The inspection apparatus may be integrated into the lithographic apparatus LA or the lithocell LC or may be a stand-alone device.

An inspection apparatus to determine one or more properties of a substrate can take various different forms. For example, the inspection apparatus may use photon electromagnetic radiation to illuminate the substrate and detect radiation redirected by the substrate; such inspection apparatuses may be referred to as bright-field inspection apparatuses. A bright-field inspection apparatus may use radiation with a wavelength in, for example, the range of 150-900 nm. The inspection apparatus may be image-based, i.e., taking an image of the substrate, and/or diffraction-based, i.e., measuring intensity of diffracted radiation. The inspection apparatus may inspect product features (e.g., features of an integrated circuit to be formed using the substrate or features of a mask) and/or inspect specific measurement targets (e.g., overlay targets, focus/dose targets, CD gauge patterns, etc.).

Inspection of, e.g., semiconductor wafers is often done with optics-based sub-resolution tools (bright-field inspection). But, in some cases, certain features to be measured are too small to be effectively measured using bright-field inspection. For example, bright-field inspection of defects in features of a semiconductor device can be challenging. Moreover, as time progresses, features that are being made using patterning processes (e.g., semiconductor features made using lithography) are becoming smaller and in many cases, the density of features is also increasing. Accordingly, a higher resolution inspection technique is used and desired. An example inspection technique is electron beam inspection. Electron beam inspection involves focusing a beam of electrons on a small spot on the substrate to be inspected. An image is formed by providing relative movement between the beam and the substrate (hereinafter referred to as scanning the electron beam) over the area of the substrate inspected and collecting secondary and/or backscattered electrons with an electron detector. The image data is then processed to, for example, identify defects.

Figure 3:
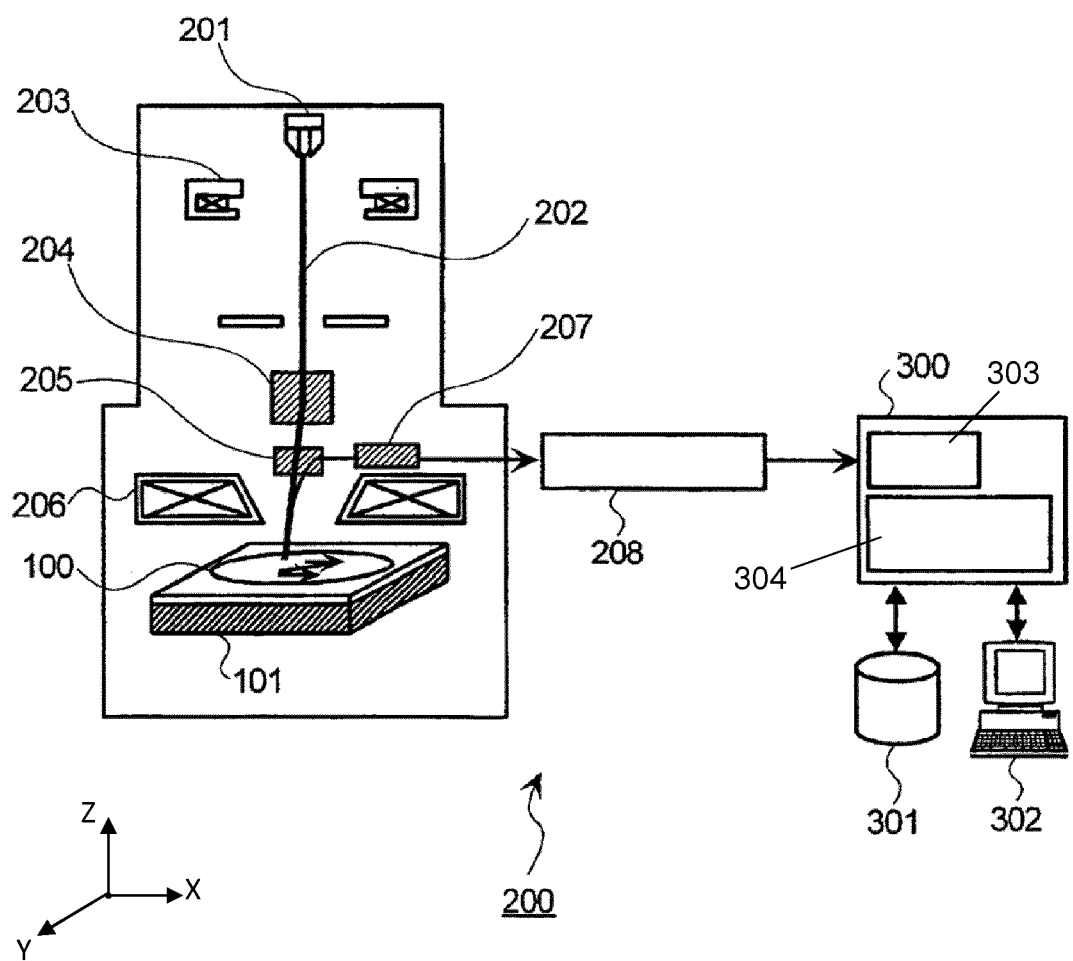
FIG. 3 schematically depicts an embodiment of a scanning electron microscope (SEM)

So, in an embodiment, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate. FIG. 3 schematically depicts an embodiment of an electron beam inspection apparatus 200. A primary electron beam 202 emitted from an electron source 201 is converged by condenser lens 203 and then passes through a beam deflector 204, an E×B deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the E×B deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 204 can provide the electron beam 202). Thus, the spatial extent of the field of the view is the spatial extent to which the angular range of the electron beam can impinge on a surface (wherein the surface can be stationary or can move with respect to the field).

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software or a computer readable medium comprising software) is configured to convert or process the digital images into datasets representative of the digital images. In an embodiment, the processing unit 304 is configured or programmed to cause execution of a method described herein. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Figure 4:
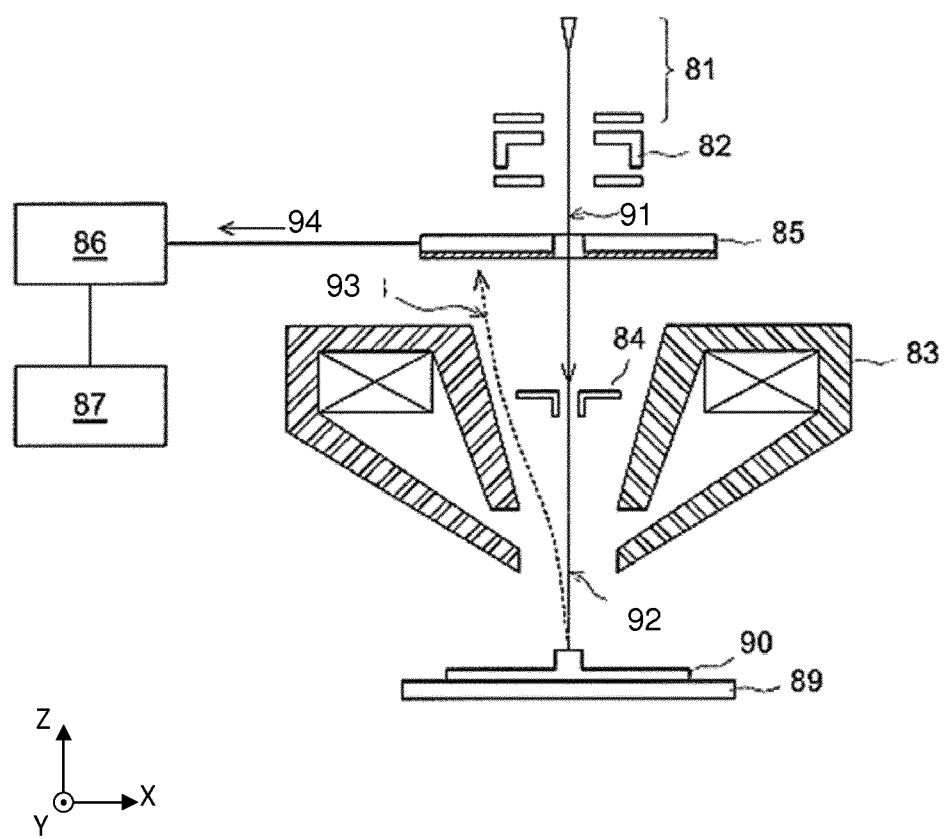
FIG. 4 schematically depicts an embodiment of an electron beam inspection apparatus.

FIG. 4 schematically illustrates a further embodiment of an inspection apparatus. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 3 that uses a probe to inspect a substrate, the electron current in the system of FIG. 4 is significantly larger compared to, e.g., a CD SEM such as depicted in FIG. 3, such that the probe spot is large enough so that the inspection speed can be fast. However, the resolution may not be as high as compared to a CD SEM because of the large probe spot.

The SEM images, from, e.g., the system of FIG. 3 and/or FIG. 4, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Now, besides measuring substrates in a patterning process, it is often desirable to use one or more tools to produce results that, for example, can be used to design, control, monitor, etc. the patterning process. To do this, there may be provided one or more tools used in computationally controlling, designing, etc. one or more aspects of the patterning process, such as the pattern design for a patterning device (including, for example, adding sub-resolution assist features or optical proximity corrections), the illumination for the patterning device, etc. Accordingly, in a system for computationally controlling, designing, etc. a manufacturing process involving patterning, the major manufacturing system components and/or processes can be described by various functional modules. In particular, in an embodiment, one or more mathematical models can be provided that describe one or more steps and/or apparatuses of the patterning process, including typically the pattern transfer step. In an embodiment, a simulation of the patterning process can be performed using one or more mathematical models to simulate how the patterning process forms a patterned substrate using a measured or design pattern provided by a patterning device.

Figure 5:
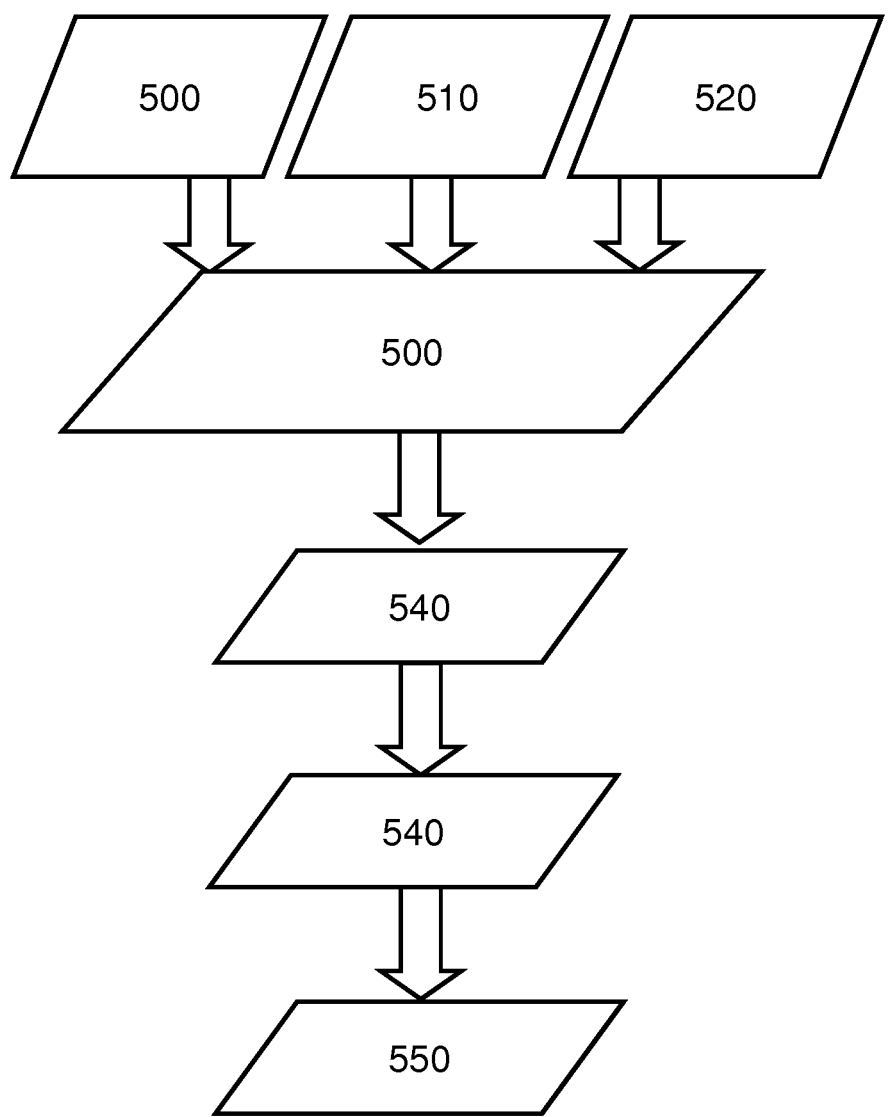
FIG. 5 depicts an example flow chart for modeling and/or simulating at least part of a patterning process.

An exemplary flow chart for modeling and/or simulating parts of a patterning process (e.g., lithography in a lithographic apparatus) is illustrated in FIG. 5. As will be appreciated, the models may represent a different patterning process and need not comprise all the models described below. A source model 500 represents optical characteristics (including radiation intensity distribution, bandwidth and/or phase distribution) of the illumination of a patterning device.

The source model 500 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 510 represents optical characteristics (including changes to the radiation intensity distribution and/or the phase distribution caused by the projection optics) of the projection optics. The projection optics model 510 can represent the optical characteristics of the projection optics, including aberration, distortion, one or more refractive indexes, one or more physical sizes, one or more physical dimensions, etc.

The patterning device model module 120 captures how the design features are laid out in the pattern of the patterning device and may include a representation of detailed physical properties of the patterning device, as described, for example, in U.S. Pat. No. 7,587,704. The objective of the simulation is to accurately predict, for example, edge placements and CDs, which can then be compared against the device design. The device design is generally defined as the pre-OPC patterning device layout, and will be provided in a standardized digital file format such as GDSII or OASIS.

A design layout model 520 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. The design layout model 520 can represent one or more physical properties of a physical patterning device, as described, for example, in U.S. Pat. No. 7,587,704, which is incorporated by reference in its entirety. Since the patterning device used in the lithographic projection apparatus can be changed, it is desirable to separate the optical properties of the patterning device from the optical properties of the rest of the lithographic projection apparatus including at least the illumination and the projection optics.

An aerial image 530 can be simulated from the source model 500, the projection optics model 510 and the design layout model 520. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 550 can be simulated from the aerial image 530 using a resist model 540. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 510.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 150. The post-pattern transfer process model 150 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

An application of the one or more models described herein in sophisticated fine-tuning steps of the patterning process, such as fine-tuning steps applied to the illumination, projection system and/or patterning device design. These include, for example, but not limited to, optimization of numerical aperture, optimization of coherence settings, customized illumination schemes, use of phase shifting features in or on a patterning device, optical proximity correction in the patterning device layout, placement of sub-resolution assist features in the patterning device layout or other methods generally defined as "resolution enhancement techniques" (RET).

As an example, optical proximity correction (OPC) addresses the fact that the final size and placement of a printed feature on the substrate will not simply be a function of the size and placement of the corresponding feature on the patterning device. For the small feature sizes and high feature densities present on typical electronic device designs, the position of a particular edge of a given feature will be influenced to a certain extent by the presence or absence of other adjacent features. In an embodiment, these proximity effects arise from coupling of radiation from more than one feature. In an embodiment, proximity effects arise from diffusion and other chemical effects during post-exposure bake (PEB), resist development, and etching that generally follow lithographic exposure.

In order to help ensure that the features are generated on a substrate in accordance with the requirements of the given device design, proximity effects should be predicted utilizing sophisticated numerical models, and corrections or pre-distortions are applied to the design of the patterning device before successful manufacturing of devices becomes possible. These modifications may include shifting or biasing of edge positions or line widths and/or application of one or more assist features that are not intended to print themselves, but will affect the properties of an associated primary feature.

The application of a model-based patterning process design requires good process models and considerable computational resources, given the many millions of features typically present in a chip design. However, applying model-based design is generally not an exact science, but an iterative process that does not always resolve all possible weaknesses of a device design. Therefore, post-OPC designs, i.e. patterning device layouts after application of all pattern modifications by OPC and any other RET's, should be verified by design inspection, e.g., intensive full-chip simulation using calibrated numerical process models, in order to reduce the possibility of design flaws being built into the manufacturing of a patterning device.

However, sometimes the model parameters may be inaccurate from, e.g., measurement and reading errors, and/or there may be other imperfections in the system. With precise calibration of the model parameters, extremely accurate simulations can be done. So, since computational patterning process evaluation should involve robust models that describe the patterning process precisely, a calibration procedure for such models should be used to achieve models that are valid, robust and accurate across the applicable process window.

To enable calibration of the computational models (and optionally in order that the substrate that is exposed by the lithographic apparatus is exposed correctly and consistently), it is desirable to take various measurements of patterns printed on a substrate using an inspection apparatus. In some embodiments, the inspection apparatus may be a scanning electron microscope (SEM) that yields an image of one or more structures (e.g., one or more test (or calibration) patterns or one or more patterns corresponding to some or all the structures of a device) exposed or transferred on the substrate.

So, in an embodiment, calibration is done by printing a certain number of 1-dimensional and/or 2-dimensional gauge patterns on a substrate (e.g., the gauge patterns may be specially designated measurement patterns or may be device parts of a design device pattern as printed on the substrate) and performing measurements on the printed patterns. More specifically, those 1-dimensional gauge patterns are line-space patterns with varying pitch and CD, and the 2-dimensional gauge patterns typically include line-ends, contacts, and/or SRAM (Static Random Access Memory) patterns. These patterns are then imaged onto a substrate and resulting substrate CDs or contact hole (also known as a via or through-chip via) energy are measured. The original gauge patterns and their substrate measurements are then used jointly to determine the model parameters which reduce or minimize the difference between model predictions and substrate measurements. In an embodiment, the one or more gauge or calibration patterns may not correspond to structures in a device. But, the one or more gauge or calibration patterns possess enough similarities with one or more patterns in the device to allow accurate prediction of the one or more device patterns.

Figure 6:
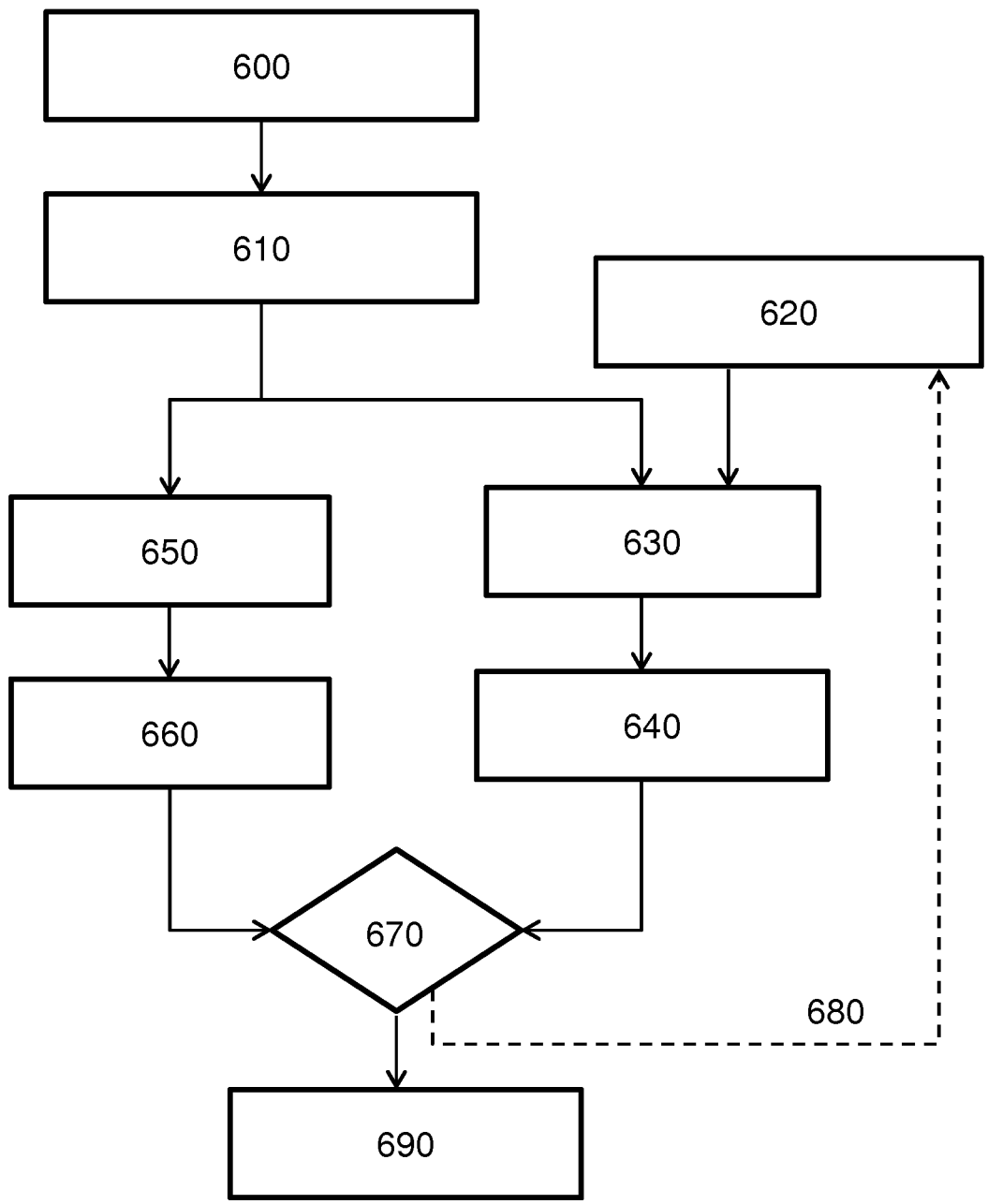
FIG. 6 depicts an example flow chart for model calibration.

An example model calibration process as described above is illustrated in FIG. 6. The process begins with a design layout 600, which can include gauge and optionally other test patterns, which can be in a standard format such as GDSII or OASIS. Next, the design layout is used to generate a patterning device layout at 610, which can be in a standard format such as GDSII or OASIS and which may include OPC or other RET features. Then, in an embodiment, two separate paths are taken, for simulation and measurement.

In a simulation path, the patterning device layout and a model 620 are used to create a simulated resist image in step 630. The model 620 provides a model of the patterning process for use in computational lithography, and the calibration process aims to make the model 620 as accurate as possible, so that computational lithography results are likewise accurate. The simulated resist image is then used to determine predicted critical dimensions (CDs), etc. in step 640.

In a measurement path, the patterning device layout 610 is used with or to form a physical mask (e.g., a reticle), which is then imaged onto a substrate at 650. The patterning process (e.g. NA, focus, dose, illumination source, etc. for optical lithography) used to pattern the substrate is the same as that intended to be captured in model 620. Measurements (e.g. using a metrology tool (such as a SEM, etc.) are then performed on the actual patterned substrate at 660, which yields measured CDs, contours, etc.

A comparison is made at 670 between the measurements from 660 and the predictions from 640. If the comparison determines that the predictions match the measurements within a predetermined error threshold, the model is considered to be successfully calibrated at 690. Otherwise, changes are made to the model 620, and steps 630, 640 and 670 are repeated until the predictions generated using the model 620 match the measurements within a predetermined threshold. In an embodiment, the model comprises an OPC model. While the description hereafter will focus on an OPC model as an embodiment, the model may be other than or in addition to an OPC model.

As noted above, values of a geometric parameter (such as CD) are extracted from an image (e.g., an image generated using an electron beam such as a SEM image) of a formed pattern on a substrate for, e.g. model calibration or for other purposes. For example, as noted above for model calibration, a gauge pattern can be used.

Figure 7:
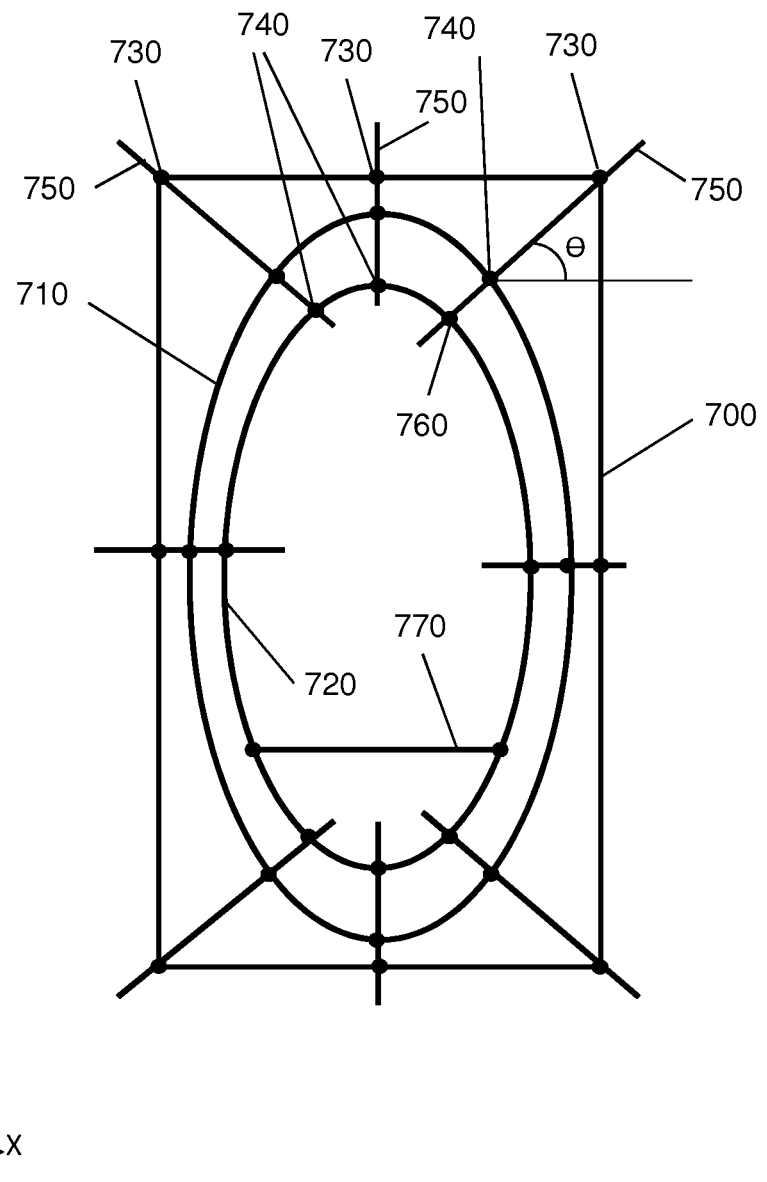
FIG. 7 schematically depicts an embodiment of a pattern analyzed according to an embodiment of a method.

Referring to FIG. 7, a schematic of a pattern (e.g., a gauge pattern) in various forms is depicted. FIG. 7 illustrates an image of a generally elliptical pattern 720 that is produced on a substrate from, e.g., a nominally rectangular design layout 700 (e.g., as designed to be produced at the substrate). While the boundary of the generally elliptical pattern 720 is depicted as a contour, it need not be a contour but rather the boundary can be the pixel data that represents the edge of the pattern 720 (that is a contour has not been extracted). Further, the pattern in FIG. 7 is an elliptical shape that protrudes from the substrate wherein the interior of the pattern 720 is higher than points immediately outside the boundary. However, the pattern 720 need not be a protrusion but could be a trench type structure; in which case, the interior of the pattern 720 is below the region immediately exterior of the boundary of pattern 720. If pattern 720 were a trench, the nominally rectangular design layout 700 may be smaller and generally in the interior of the pattern 720.

In an image of the pattern, gauges are specified and evaluated. In an embodiment, the gauges are the evaluation locations on the pattern to determine values of a geometric parameter such as CD, edge position, etc. The values of the gauges can be used for various purposes in design, control, etc. of a patterning process, an apparatus of the patterning process or a tool used with design, control, etc. of a patterning process. In one particular example, the values of gauges are used for calibration of, for example, an OPC model. So, in that case, the calibration of an OPC model is effectively aiming to create a model that minimizes an error associated with the gauges. While an embodiment of the determination of gauge values for model calibration is described here specifically, it will be appreciated that the determination of gauge values can be used for various purposes.

In FIG. 7, an example gauge is illustrated as imaginary line 770 that is superimposed on the boundary (e.g., contour) of a shape of the pattern that is measured, i.e., the gauge 770 for CD in the X direction. As will be appreciated, numerous other gauges can be specified (e.g., more gauges in the X direction and gauges in the Y direction). Gauge 770 is sometimes referred to as a cutline and so facilitates the measurement distance of a selected "cut" on the pattern. The cutline is typically aligned in the X and/or Y direction and in some cases a certain angle. Another example gauge is an evaluation point (EP) 760. An EP 760 does not necessarily require another corresponding point on a line like a cutline. A gauge 770 or an EP 760 is normally collected from a substrate pattern contour (i.e., the pattern image is processed to create a contour and then the edge position at the EP is extracted from the contour at the desired EP).

The gauges are positioned at specific spots in a pattern layout and essentially represent the points at the boundary of the pattern. Desirably, a number of gauges are selected to be representative of the shape of the pattern but the number of gauges are limited by, e.g., throughput concerns and diminishing returns (e.g., while more gauges will provide greater accuracy, it may not provide much more). Indeed, thousands of different measurements and/or shapes are made for any given OPC model, so there is a variety of shapes present on any substrate that are measured and all of them should be measured well if they are to report values that correspond to what the actual OPC model would like to have as far as information corresponding to the gauge positions.

As model calibration is done per edge around the pattern design layout (e.g., a polygon), for advanced technology nodes, evaluation points (EPs) can provide more comprehensive sampling of the pattern boundary than cutlines and thus enable improvement in model calibration. As noted above, evaluation of the EP and/or gauge typically involves extraction of the contour of the pattern from the image of the pattern (e.g., using techniques of contour extraction known in the art), which contour is able to represent the substrate pattern.

However, contour extraction can introduce artifacts and/or errors since the algorithms to extract the contour may not perfectly determine the contour around the entirety of the shape of the pattern. Such artifacts and/or errors can impact the model accuracy. Similarly, smoothing techniques applied to the contour can similarly introduce artifacts and/or errors.

Additionally or alternatively, to improve the quality of the contour extraction, the substrate pattern image quality should be high and so more image frames of the pattern can be captured and averaged together to obtain the higher quality pattern image from which the contour is extracted. Unfortunately, the more frames that are captured the more the substrate pattern is damaged by the incident electron beam radiation. This leads to additional error due to determining a contour from an image comprising data from a significantly damaged pattern feature.

Additionally or alternatively, the contour is typically constructed with many more location points around the pattern boundary than what is required for EP sampling per pattern. For example, the contour is typically extracted for the entire pattern boundary. But, even with those extra available location points, often interpolation is still needed to provide desired EP locations because the contour location points may not correspond to all the desired EP locations.

Therefore, the contour extraction for EP gauge evaluation can result in a large contour data file, long computational time for contour extraction and/or EP positional error due to, for example, artifacts/errors in contour extraction and/or from interpolation.

So it is desired to provide an improved technique for determining EP locations on a pattern image and obtaining the values of a geometric parameter at EP locations.

In an embodiment, a simulated contour of a pattern under consideration (and that is generated using, e.g., a design layout of the pattern) is used to effectively pre-generate EP locations. Then, the pre-generated EP locations are used to identify the associated EP locations on an image of at least part of the formed pattern. In an embodiment, the image EP locations are determined without extraction of a contour from the image. In an embodiment, data related to the pre-generated EP locations are used to guide measurement of the image of the pattern. From the image EP locations, spatial positions or dimensions associated with the EPs at the image EP locations can be determined from the image.

In an embodiment, an inspection tool (such as an electron beam inspection apparatus) measures the EPs (e.g., determines their spatial position in a coordinate system or measures a dimension associated them) according the pre-generated EP locations from the image, e.g., directly without contour extraction or with reduced contour extraction. In an embodiment, the inspection apparatus can do image measurement in effectively real-time per image and so there would be no additional throughput impact on top of the imaging time. In an embodiment, the throughput can be reduced by not having to perform a contour extraction or a contour extraction only at one or more select portions. Additionally or alternatively, by direct measurement on an image (i.e., measurement on the image without contour extraction of the part measured), fewer image frames of the pattern may be required compared to the number of image frames needed for contour extraction and the measurement can be closer to the real pattern (i.e., less damage to the pattern than would otherwise be required to obtain the larger number of image frames for contour extraction). Additionally or alternatively, image acquisition throughput could be significantly improved as fewer image frames may need to be captured (particularly for large images and/or a large number of patterns).

Figure 8:
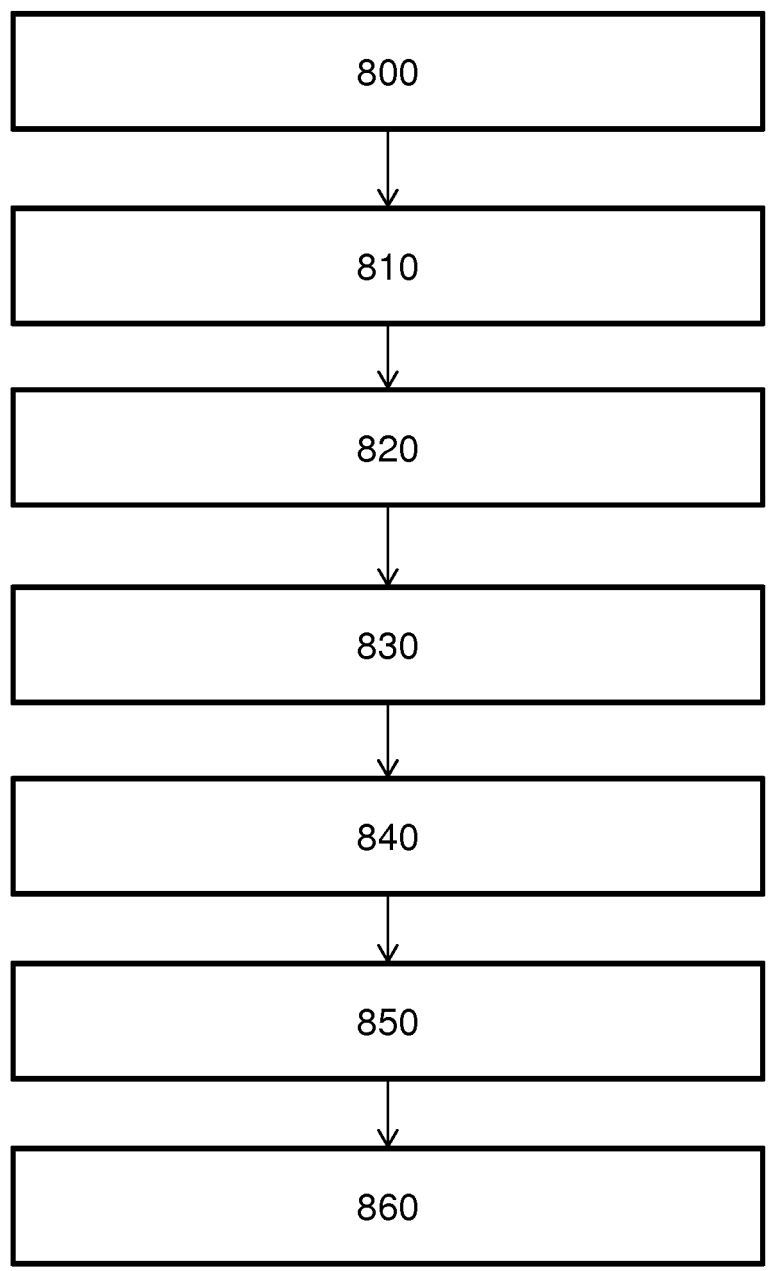
FIG. 8 depicts an example flow chart for an evaluation point (EP) analysis method.

FIG. 8 is a flow chart of an embodiment of a method of determining EP locations on a pattern image and obtaining the values of a geometric parameter at the EP locations. At 800, a simulated target contour of a pattern is obtained at one or more nominal processing conditions of the patterning process used to produce the pattern on a substrate. In an embodiment, the simulated target contour is determined based on a design layout for the pattern as formed on the substrate. In an embodiment, the design layout is in the form of a polygon; in that case, the design layout would be a target polygon. While an embodiment will be described in relation to a target polygon, the embodiments are generally applicable to any design layout for the pattern. In an embodiment, a simulation is run to obtain the simulated target contour. In an embodiment, a simulation model as described with respect to FIG. 5 can be used.

Referring to back to FIG. 7, a schematic example of a simulated target contour is depicted along with a target polygon. As seen in FIG. 7, a target polygon 700 is depicted along with a simulated target contour 710. As will be appreciated, a formed pattern will typically not match the target polygon exactly and that is shown here by the rounding of the simulated target contour compared to the target polygon Further, the formed pattern often may not have the same cross-sectional dimensions as the target polygon and that is shown here by the shrinking of the simulated target contour compared to the target polygon. As will be appreciated, the simulated target contour need not be rounded as schematically depicted and/or need not have smaller cross-sectional dimensions.

The target polygon will have one or more EPs located on or at the target polygon boundary. Typically, there will be a plurality of EPs specified along the target polygon boundary. The locations of the EPs for the target polygon can be selected by the user or be automatically determined. In an embodiment, a plurality of EPs can be specified uniformly along the boundary of the target polygon. In an embodiment, an EP can be specified for at least corner of the polygon. In an embodiment, an EP can be specified for each corner of a target polygon. In an embodiment, a greater concentration of EPs is specified for a corner than along a straight portion of the polygon. In an embodiment, the number of EPs specified for a target polygon is 5 or more, 10 or more, 20 or more, or 50 or more.

Having the simulated target contour and the target polygon, at 810, the locations on the nominal simulated target contour of one or more EPs are determined based on the target polygon. That is, one or more EPs are defined with respect to the target polygon and a corresponding EP location is determined on the simulated target contour for each such EP defined with respect to the target polygon. For example, as shown in FIG. 7, one or more EPs 730 are defined on the target polygon 700 and for each EP 730, there is determined a EP location 740 on the simulated target contour 710. While 3 sets of corresponding EP 730 and EP 740 are marked in FIG. 7, further example sets of corresponding EP on the target polygon and on the simulated target contour are shown in FIG. 7.

Imaginary line 750 helps to depict the spatial relationship between the locations of EP 730 and EP 740. In an embodiment, the location of EP 740 corresponding to an associated EP 730 is the nearest location on the simulated target contour 710 to the location of EP 730. That is, a substantially shortest distance is found between an EP 730 and the simulated target contour 710 and that location becomes the location of EP 740. Thus, in an embodiment, the portion of line 750 between EP 730 and EP 740 is a substantially shortest distance. In an embodiment, the substantially shortest distance can be selected from the range of 90% of the shortest distance to 110% of the shortest distance. In an embodiment, the location of EP 740 corresponds to the location on the simulated target contour 710 at which an imaginary line (e.g., line 750) that is substantially perpendicular to a tangent to, or that is substantially perpendicular to the side of, a portion of the simulated target contour 710 nearest to the EP 730 runs through EP 730. In an embodiment, substantially perpendicular can be selected from 80° to 110°.

So, the determined location of EP 740 from associated EP 730 establishes a spatial bearing between the locations of EP 730 and 740. The imaginary line 750 helps depict this spatial bearing. As will be described in further detail below, the location of an EP 760 on a measured image of the pattern will be determined using this spatial bearing by, e.g., locating the periphery of the measured pattern image along this spatial bearing.

At 820, information regarding the spatial bearing is produced for use in determining the location of an EP on a measured pattern image. So, in an embodiment, for each EP of interest defined with respect to the target polygon, there is provided electronic information regarding the spatial bearing for that EP. In an embodiment, the information is specified for the coordinate system of the measured pattern image. In an embodiment, the information is specified in the GDS, GDSII or OASIS coordinate system. In an embodiment, the information is specified in the coordinate system of the inspection apparatus for the image. Where necessary, in an embodiment, the information regarding the spatial bearing comprises identifying information regarding the pattern to enable an inspection apparatus to locate the pattern (to which the EP information is related) as formed on the substrate or to locate that pattern in an image of the substrate comprising the pattern.

In an embodiment, the information regarding the spatial bearing comprises the location of each EP 730 and associated EP 740. Using the locations of EP 730 and EP 740, a spatial bearing direction can be calculated. In an embodiment, the spatial bearing direction comprises an angle, a slope or other representation of direction. In an embodiment, the information comprises the location of EP 730 and/or of EP 740 and a spatial bearing direction (e.g., angle). An example of the spatial bearing direction is shown as angle θ in FIG. 7.

At 830, an image of the pattern formed on a substrate by the patterning process at the nominal conditions is obtained. In an embodiment, the image is obtained by measurement with an electron beam. In an embodiment, the image is a SEM image. In an embodiment, prior to obtaining a value of a geometric parameter from the image for an EP, the image is aligned with the coordinate system of the target polygon (e.g., target polygon 700) and/or the simulated contour of the pattern (e.g., simulated target contour 710). In an embodiment, prior to obtaining a value of a geometric parameter from the image for an EP, the image is aligned with the GDS, GDSII or OASIS coordinate system, which can be done by Die to Database (D2DB) functionality of, e.g., an inspection apparatus.

In an embodiment, obtaining the image comprises measuring a formed pattern on the substrate using an inspection apparatus (such as an apparatus as described with respect to FIG. 3 and/or 4). In an embodiment, the measuring of the formed pattern is guided by the information regarding the spatial bearing. That is an embodiment the pattern is specially measured at regions along the spatial bearing direction corresponding to each of the one or more EPs for which spatial bearing information is provided. For example, the location of EP 730 and/or of EP 740 with respect to associated formed pattern can be determined, if necessary, in the coordinate system of the inspection apparatus and then a measurement can be taken within a threshold distance from that location of EP 730 and/or of EP 740 with respect to the formed pattern and along the spatial bearing direction (which can be determined, by, e.g., the inspection apparatus, from the information regarding the locations of EP 730 and EP 740 or which be included with the spatial bearing information). In an embodiment, the guided measurement comprises the inspection apparatus obtaining extra measurement information at the regions of the pattern. In an embodiment, the guided measurement comprises the inspection apparatus obtaining measurement information at the regions of the pattern but not at other locations on the pattern.

At 840, a determination of the location of one or more EPs on the measured pattern image is performed. If necessary, the image is aligned with the coordinate system of the spatial bearing information, e.g., with the GDS, GDSII or OASIS coordinate system, or with a simulated pattern contour (e.g., by a computer image processing technique that can mathematically align the simulated target contour with the generalized shape of the formed pattern in the image), or with the locations of a collection of spatially distributed EPs 730 and/or of EPs 740 (e.g., by a computer image processing technique that can mathematically align the spatially distributed EPs 730 and/or of EPs 740 with the generalized shape of the formed pattern in the image). The alignment can be done using die to database (D2DB) capabilities of an inspection apparatus.

To determine the location of the one or more EPs on the measured pattern image, a spatial bearing direction included in, or derived from, the spatial bearing information is used along with the location of an associated EP on the simulated target contour and/or of an associated EP on the target polygon. In an embodiment, where the spatial bearing information does not include the spatial bearing direction, the spatial bearing direction can be calculated from the EP location of an EP on the simulated target contour and the location of the associated EP on the target polygon included in the spatial bearing information.

In particular, to determine the location of the one or more EPs on the measured pattern image, the location of the associated EP on the simulated target contour and/or from the associated EP on the target polygon in the image coordinate system is determined or marked and the image is analyzed along the spatial bearing direction from the location of the associated EP on the simulated target contour in the image coordinate system and/or from the associated EP on the target polygon in the image coordinate system to identify where along the spatial bearing direction the boundary of the pattern is intercepted. So, in an embodiment and in the context of FIG. 7, the result is effectively determining the intercept of the imaginary line 750 with the boundary of the measured pattern image 720 to identify the location of EP 760 on the pattern image 720 at that intersection. Of course, a line need not be drawn on an image to accomplish identifying this intercept. Rather, a data processing technique can be applied along the direction 750 from the location of EP 730 in the image coordinate system and/or of EP 740 in the image coordinate system to identify where the boundary of the pattern image 720 is reached. The image data processing technique to identify the boundary can be any present or future technique for this purpose. In an embodiment, a known measurement algorithm (e.g., CD measurement algorithm) and associated threshold can be used as used for, e.g., cutline gauge determination. For example, in an embodiment, the image data processing can evaluate the gradient of the values of the pixel data and identify the boundary where the gradient crosses or meets a certain threshold (e.g., the maximum gradient or within 10% of the maximum). This technique can enable the identification of the boundary as a location somewhere on the up or down slope of the edge of the pattern (e.g., about the middle of the slope or a position on the slope about 10-30% from the bottom).

Figure 9:
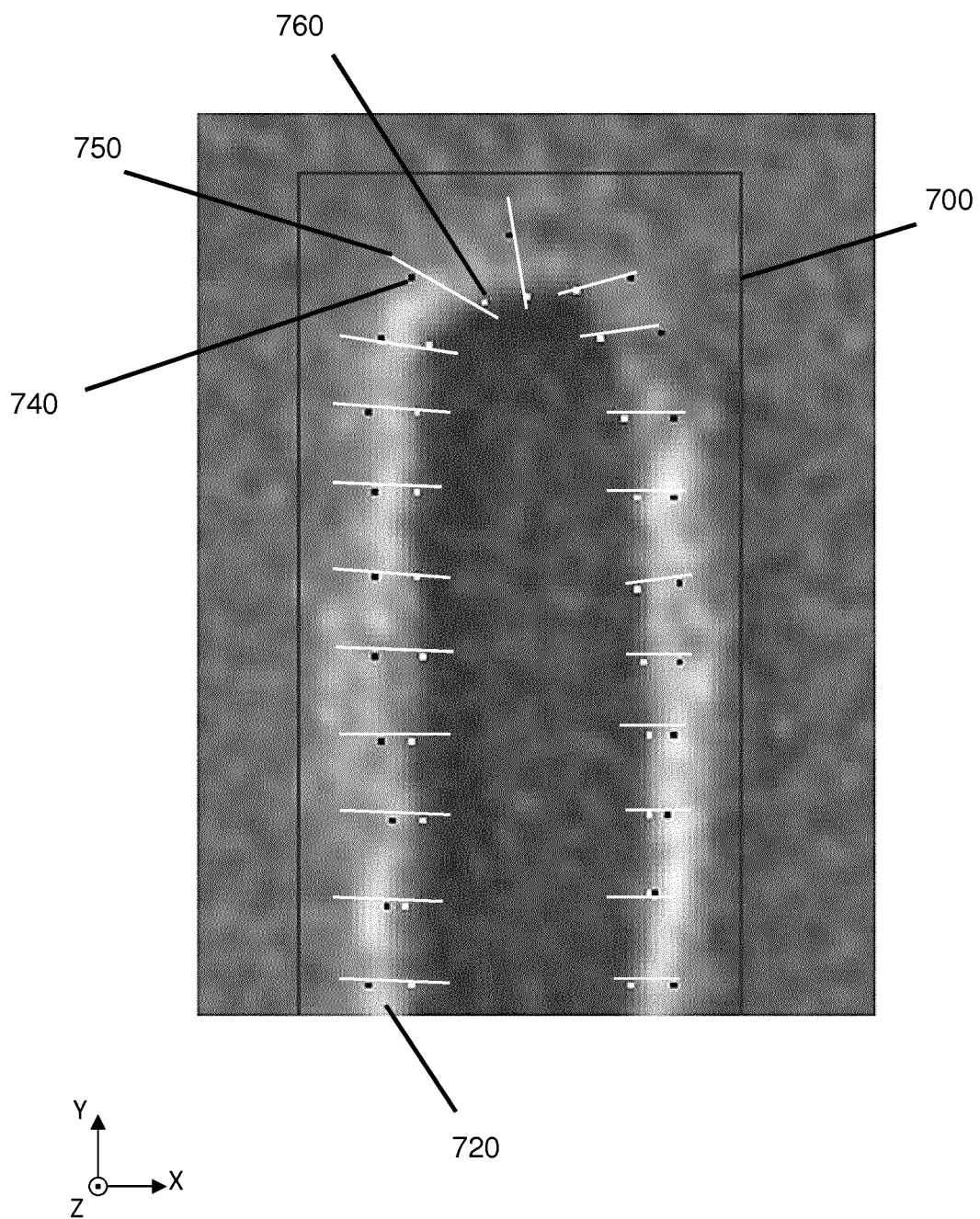
FIG. 9 schematically depicts an embodiment of a part of a pattern analyzed according to an embodiment of a method.

A practical example of this determination is depicted in FIG. 9. FIG. 9 shows an image of a portion of a pattern. The measured boundary 920 of the pattern is shown along with the applicable portion of the target polygon 700 (which is shown for reference in this example and need not be "drawn" on the image). In this example, the spatial bearing information used is the location of EP 740 (i.e., the location of an EP on the simulated target contour) along with a spatial bearing angle, which is represented in this example by imaginary line 750. While only a single location of EP 740 is marked here for convenience, it is apparent that FIG. 9 depicts a plurality of other locations of EPs 740 at various points along the boundary 920. Further, the lines do not precisely pass through the EPs 740 in this example merely so that the EPs 740 can be visually seen. In practice, the spatial bearing angles will pass through the respective EPs 740.

Then, it can be seen that the intercept of the imaginary line 750 with the boundary of the measured pattern image 720 identifies the location of EP 760 on the pattern image 720 at that intersection. The pixel data along the imaginary line 750 can be processed to identify the location of the edge/boundary of the pattern, which was determined in this case as being the location where EP 760 is marked. This data processing can be done using an algorithm such as, for example, an analysis of the gradient of the pixel data and then the location of the EP 760 being identified where the gradient data meets or crosses some threshold associated with that gradient data. So, in an embodiment, the EP location is determined on the image (e.g., aligned with GDS, GDSII or OASIS coordinate system) based on a reference location (e.g., EP 730 and/or EP 740) and a threshold that identifies the boundary of the pattern.

In an embodiment, the identified location of EP 760 on the pattern image 720 at that intersection as discussed above can represent the measurement of the EP 760. Thus, in an embodiment, an EP location of a pattern on a substrate can be directly determined from an image (e.g., after alignment with the target polygon and/or the simulated target contour such as by alignment with GDS, GDSII or OASIS coordinate system) based on a certain measurement method (e.g., a known measurement algorithm (e.g., CD measurement algorithm) and associated threshold used for, e.g., cutline gauge determination).

In an embodiment, the location of the EP 760 on a contour of the pattern image 720 can be the measurement of the EP 760. For example, in an embodiment, a contour of the image can be obtained at or near the identified location of EP 760 on the pattern image 720 and the measurement of EP 760 is the location of EP 760 on the contour. In an embodiment, the contour of the image does not encompass the entire boundary of the pattern. In an embodiment, the contour is obtained so as to include the identified location of EP 760 on the pattern image 720 so as to be able to avoid interpolation.

As will be appreciated, this analysis can be performed with respect to all the EPs 740 (using their respective spatial bearing information) along the boundary of the pattern to obtain the values of the measurements of EPs 760 along the perimeter of the pattern 720. Of course, the locations of EPs 740, the imaginary lines 750 and/or the locations of EPs 760 need not be "drawn" on the image. Rather, the image data can be mathematically processed to achieve the same effect.

Optionally, a distance between the location of an EP 740 and a measurement of its associated EP 760 can be determined. In an embodiment, the distance is the Euclidean distance between the location of EP 740 and the measurement of EP 760. In an embodiment, this distance represents an edge placement error (EPE).

Figure 10:
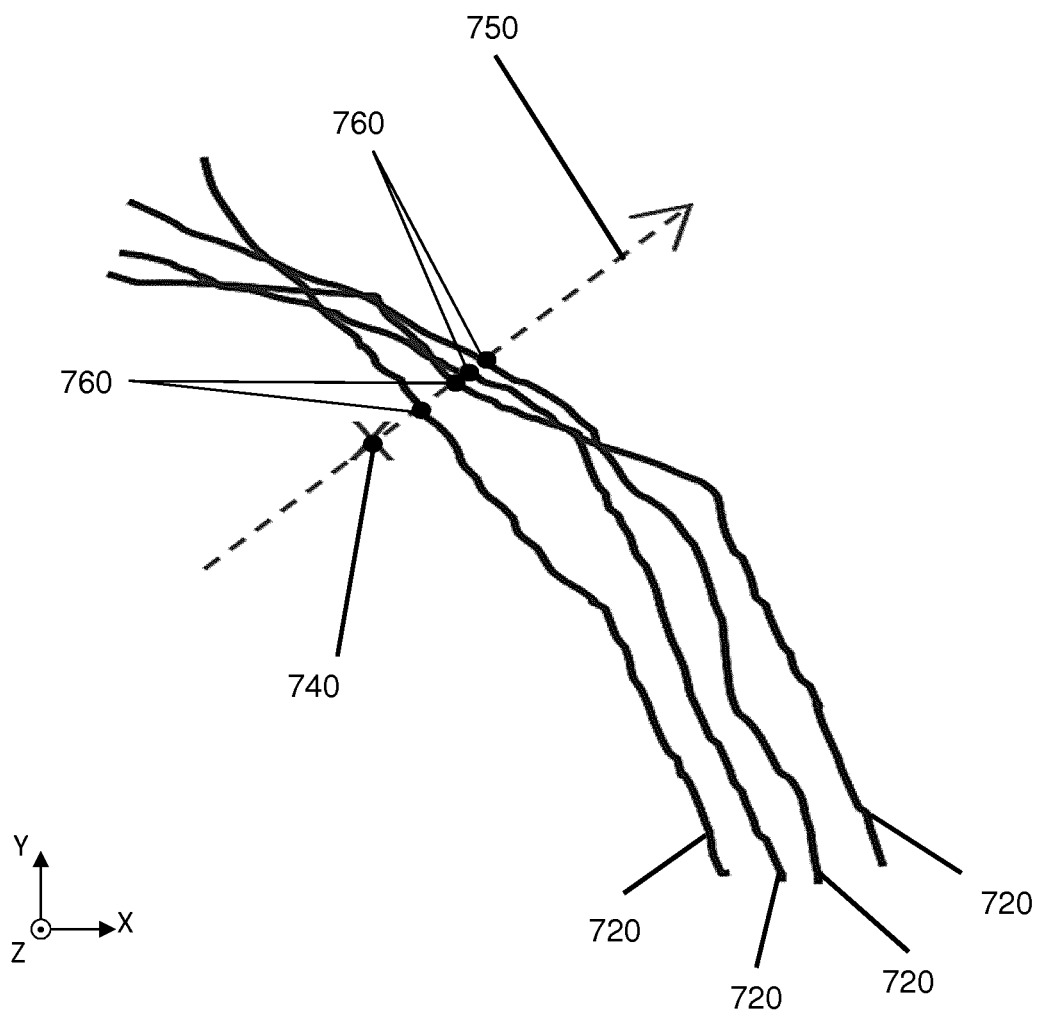
FIG. 10 schematically depicts an embodiment of a part of a pattern analyzed according to an embodiment of a method.

Optionally, referring to FIG. 10, an "averaged" determination of the location of EP 760 can be obtained. FIG. 10 shows a portion of the boundary of a pattern image 720 for a plurality of different instances of the same pattern. In an embodiment, the pattern can be a contact hole pattern and so the plurality of instances can be various instances of the contact hole pattern formed on a substrate.

In an embodiment, the "averaged" determination of the location of EP 760 can be obtained by determining the location of the evaluation point on the measured image of the at least part of the pattern for each of a plurality of different instances of the at least part of the pattern. Then, the location can be based on a mathematical combination of the determined locations (e.g., an average of the locations). For example, as shown in FIG. 10, the imaginary line 750 extends relative to the location of an EP 740 defined with respect to a simulated contour of the pattern. The imaginary line 750 intercepts a plurality of instances of a pattern image 720 at various locations of EP 760. In an embodiment, those determined locations of EP 760 can be mathematically combined to yield a single value of the location for EP 760. In an embodiment, that combination can be an average or other statistical combination.

In an embodiment, the "averaged" determination of the location of EP 760 can be obtained by combination of the images of the different instances of the at least part of the pattern into a "single" image of the at least part of the pattern. The location of EP 760 can then be determined from that combination image using, e.g., an imaginary line 750 extending relative to the location of an EP 740 defined with respect to a simulated contour of the pattern.

Of course, that identified location of EP 760 can represent the measurement of the EP 760 or the location of the EP 760 on a contour of the pattern image 720 can be the measurement of the EP 760. Of course, a distance between the location of an EP 740 and a measurement of its associated EP 760 can be determined using the "averaged" determination of the location of EP 760.

At 850, EP spatial parameter information is output. In an embodiment, the EP spatial parameter information is electronic information comprising values for the one or more EPs analyzed. In an embodiment, the EP spatial parameter information comprises the measurement of one or more locations of EPs 760. In an embodiment, the one or more locations can be Cartesian coordinates in, for example, the coordinate system of the image or some other coordinate system. In an embodiment, the EP spatial parameter information comprises the distance between one or more EP 740 locations and a measurement of its associated one or more EPs 760. In an embodiment, the EP spatial parameter information can be based on an "averaged" determination as discussed above.

At 860, the EP spatial parameter information can be used for process modeling, model calibration (including recalibration), defect detection, estimation, characterization or classification, yield estimation, process control or monitoring, patterning process design, etc.

So, this EP technique can enable faster determination of EP data by, for example, reducing the data analysis time. For example, the measurement and analysis can be done in near real-time.

Additionally or alternatively, in an embodiment, the results can be already mapped with GDS, GDSII and/or OASIS reference points where, for example, the image is so aligned. This can facilitate, e.g., model calibration where, for example, the model is aligned with such a coordinate system.

Additionally or alternatively, the EP technique can avoid some or all contour extraction from an image, which contour extraction can introduce artifacts and/or errors.

Additionally or alternatively, the EP technique can avoid or reduce the number of images frames of the pattern taken with electron beam irradiation and thus improve the quality of the results. This is because extra frames introduce damage to the pattern and which damages is measured in the subsequent image frames.

Additionally or alternatively, the EP technique can reduce the number of sampling points and/or reduce the need for interpolation, since select EP locations can be used and determined.

Therefore, the EP technique can help avoid contour extraction (and an associated large contour data file), reduce computational time and/or reduce EP positional error due to, for example, artifacts/errors in contour extraction and/or from interpolation.

In an embodiment, there is provided a method comprising: obtaining a simulation of a contour of a pattern to be formed on a substrate using a patterning process; determining, by a hardware computer system, a location of an evaluation point on the simulated contour of the pattern, the location spatially associated with a location of a corresponding evaluation point on a design layout for the pattern; and producing, by the hardware computer system, electronic information corresponding to a spatial bearing between the location of the evaluation point on the simulated contour and the location of the corresponding evaluation point on the design layout, wherein the information corresponding to the spatial bearing is configured for determining a location of an evaluation point on a measured image of at least part of the pattern, the evaluation point on the measured image spatially associated with the corresponding evaluation point on the design layout.

In an embodiment, the location of the evaluation point on the simulated contour of the pattern is spatially associated with the location of the corresponding evaluation point on the design layout by the location of the evaluation point on the simulated contour of the pattern being the location on the simulated contour that is the substantially shortest distance between the contour and the location of the corresponding evaluation point on the design layout. In an embodiment, the information corresponding to the spatial bearing comprises the location of the evaluation point on the simulated contour of the pattern and/or of the corresponding evaluation point on the design layout and a direction between the locations of the evaluation point on the simulated contour of the pattern and the corresponding evaluation point on the design layout. In an embodiment, the direction comprises an angle or slope. In an embodiment, the information corresponding to the spatial bearing comprises a location of the evaluation point on the simulated contour of the pattern and of the corresponding evaluation point on the design layout. In an embodiment, the method further comprises: obtaining a measured image of at least part of the pattern formed on a substrate; determining, based on the spatial bearing information, the location of the evaluation point on the measured image of at least part of the pattern, the evaluation point on the measured image spatially associated with the corresponding evaluation point on the design layout; and outputting spatial parameter information based on the determined location. In an embodiment, the method further comprises determining a distance between the location of the evaluation point on the simulated contour of the pattern and a measurement associated with the evaluation point on the measured image of the at least part of the pattern and wherein the spatial parameter information comprises the determined distance. In an embodiment, the method further comprises performing a calibration of a mathematical model representing at least part of the patterning process based on the spatial parameter information. In an embodiment, the method further comprises performing a computer simulation to produce the simulated contour of the pattern.

In an embodiment, there is provided a method comprising: obtaining electronic information corresponding to a spatial bearing between a location of an evaluation point on a simulated contour of a pattern to be formed on a substrate using a patterning process and a location of a corresponding evaluation point on a design layout for the pattern; obtaining a measured image of at least part of the pattern; determining, by a hardware computer system and based on the spatial bearing information, a location of an evaluation point on the measured image of the at least part of the pattern, the evaluation point on the measured image spatially associated with the corresponding evaluation point on the design layout; and outputting spatial parameter information based on the determined location.

In an embodiment, the location of the evaluation point on the simulated contour of the pattern is the location on the simulated contour that is the substantially shortest distance between the contour and the location of the corresponding evaluation point on the design layout. In an embodiment, the information corresponding to the spatial bearing comprises the location of the evaluation point on the simulated contour of the pattern and/or of the corresponding evaluation point on the design layout and a direction between the locations of the evaluation point on the simulated contour of the pattern and the corresponding evaluation point on the design layout. In an embodiment, the direction comprises an angle or slope. In an embodiment, the information corresponding to the spatial bearing comprises a location of the evaluation point on the simulated contour of the pattern and of the corresponding evaluation point on the design layout. In an embodiment, the method further comprises determining a distance between the location of the evaluation point on the simulated contour of the pattern and a measurement associated with the evaluation point on the measured image of the at least part of the pattern and wherein the spatial parameter information comprises the determined distance. In an embodiment, the method further comprises performing a computer simulation to produce the simulated contour of the pattern. In an embodiment, the method further comprises performing a calibration of a mathematical model representing at least part of the patterning process based on the spatial parameter information. In an embodiment, the location of the evaluation point on the measured image of the at least part of the pattern is determined for a plurality of different instances of the at least part of the pattern and the spatial parameter information is based on a mathematical combination of the determined locations, or wherein the measured image of the at least part of the pattern is a combination of images of different instances of the at least part of the pattern.

An embodiment may include a computer program containing one or more sequences of machine-readable instructions that enable practice of a method as described herein. This computer program may be included, for example, with or within the apparatus of any of FIGS. 1-4. There may also be provided a data storage medium (e.g., semiconductor memory, magnetic or optical disk) having such a computer program stored therein. Where an existing apparatus, for example of the type shown in any FIGS. 1-4, is already in production and/or in use, an embodiment can be implemented by the provision of updated computer program products for causing a processor of the apparatus to perform a method as described herein.

The embodiments may further be described using the following clauses:

1. A method comprising:
   obtaining a simulation of a contour of a pattern to be formed on a substrate using a patterning process;
   determining, by a hardware computer system, a location of an evaluation point on the simulated contour of the pattern, the location spatially associated with a location of a corresponding evaluation point on a design layout for the pattern; and
   producing, by the hardware computer system, electronic information corresponding to a spatial bearing between the location of the evaluation point on the simulated contour and the location of the corresponding evaluation point on the design layout, wherein the information corresponding to the spatial bearing is configured for determining a location of an evaluation point on a measured image of at least part of the pattern, the evaluation point on the measured image spatially associated with the corresponding evaluation point on the design layout.

2. The method of clause 1, wherein the location of the evaluation point on the simulated contour of the pattern is spatially associated with the location of the corresponding evaluation point on the design layout by the location of the evaluation point on the simulated contour of the pattern being the location on the simulated contour that is the substantially shortest distance between the contour and the location of the corresponding evaluation point on the design layout.

3. The method of clause 1 or clause 2, wherein the information corresponding to the spatial bearing comprises the location of the evaluation point on the simulated contour of the pattern and/or of the corresponding evaluation point on the design layout and a direction between the locations of the evaluation point on the simulated contour of the pattern and the corresponding evaluation point on the design layout.

4. The method of clause 4, wherein the direction comprises an angle or slope.

5. The method of any of clauses 1-4, wherein the information corresponding to the spatial bearing comprises a location of the evaluation point on the simulated contour of the pattern and of the corresponding evaluation point on the design layout.

6. The method of any of clauses 1-5, further comprising:
   obtaining a measured image of at least part of the pattern formed on a substrate; determining, based on the spatial bearing information, the location of the evaluation point on the measured image of at least part of the pattern, the evaluation point on the measured image spatially associated with the corresponding evaluation point on the design layout; and outputting spatial parameter information based on the determined location.

7. The method of clause 6, further comprising determining a distance between the location of the evaluation point on the simulated contour of the pattern and a measurement associated with the evaluation point on the measured image of the at least part of the pattern and wherein the spatial parameter information comprises the determined distance.

8. The method of clause 6 or clause 7, further comprising performing a calibration of a mathematical model representing at least part of the patterning process based on the spatial parameter information.

9. The method of any of clauses 1-8, further comprising performing a computer simulation to produce the simulated contour of the pattern.

10. A method comprising:
   obtaining electronic information corresponding to a spatial bearing between a location of an evaluation point on a simulated contour of a pattern to be formed on a substrate using a patterning process and a location of a corresponding evaluation point on a design layout for the pattern; obtaining a measured image of at least part of the pattern;
   determining, by a hardware computer system and based on the spatial bearing information, a location of an evaluation point on the measured image of the at least part of the pattern, the evaluation point on the measured image spatially associated with the corresponding evaluation point on the design layout; and
   outputting spatial parameter information based on the determined location.
11. The method of clause 10, wherein the location of the evaluation point on the simulated contour of the pattern is the location on the simulated contour that is the substantially shortest distance between the contour and the location of the corresponding evaluation point on the design layout.
12. The method of clause 10 or clause 11, wherein the information corresponding to the spatial bearing comprises the location of the evaluation point on the simulated contour of the pattern and/or of the corresponding evaluation point on the design layout and a direction between the locations of the evaluation point on the simulated contour of the pattern and the corresponding evaluation point on the design layout.
13. The method of clause 12, wherein the direction comprises an angle or slope.
14. The method of any of clauses 10-13, wherein the information corresponding to the spatial bearing comprises a location of the evaluation point on the simulated contour of the pattern and of the corresponding evaluation point on the design layout.
15. The method of any of clauses 10-14, further comprising determining a distance between the location of the evaluation point on the simulated contour of the pattern and a measurement associated with the evaluation point on the measured image of the at least part of the pattern and wherein the spatial parameter information comprises the determined distance.
16. The method of any of clauses 10-15, further comprising performing a computer simulation to produce the simulated contour of the pattern.
17. The method of any of clauses 10-16, further comprising performing a calibration of a mathematical model representing at least part of the patterning process based on the spatial parameter information.
18. The method of any of clauses 10-17, wherein the location of the evaluation point on the measured image of the at least part of the pattern is determined for a plurality of different instances of the at least part of the pattern and the spatial parameter information is based on a mathematical combination of the determined locations, or wherein the measured image of the at least part of the pattern is a combination of images of different instances of the at least part of the pattern.
19. A method of manufacturing devices wherein a device pattern is applied to a series of substrates using a patterning process, the method including evaluating a patterned structure formed using the patterning process using the method of any of clauses 1-18 and controlling the patterning process for one or more of the substrates in accordance with a result of the method.
20. A non-transitory computer program product comprising machine-readable instructions configured to cause a processor to cause performance of the method of any of clauses 1-19.
21. An inspection system, comprising:
   an inspection apparatus; and
   an analysis engine comprising the non-transitory computer program product of clause 20.
22. The system of clause 21, wherein the inspection apparatus comprises an electron beam inspection apparatus.
23. The system of clause 21 or clause 22, further comprising a lithographic apparatus comprising a support structure configured to hold a patterning device to modulate a radiation beam and a projection optical system arranged to project the modulated radiation beam onto a radiation-sensitive substrate.

An embodiment of the invention may take the form of a computer program containing one or more sequences of machine-readable instructions to cause execution of a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Although specific reference may be made in this text to the manufacture of ICs, it should be understood that the description herein has many other possible applications. For example, it may be employed in the manufacture of integrated optical systems, guidance and detection patterns for magnetic domain memories, flat-panel displays, micro-electro mechanical systems (MEMS), liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Unless specifically noted otherwise, the terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

It is noted that the terms "mask", "reticle", "patterning device" are utilized interchangeably herein. Also, a person skilled in the art will recognize that, especially in the context of lithography simulation/optimization, the term "mask"/"patterning device" and "design layout" can be used interchangeably, as in lithography simulation/optimization, that a physical patterning device is not necessarily used but a design layout can be used to represent a physical patterning device.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

In an optimization process of a system or process, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system or process can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image or pattern on a substrate, as well as non-physical characteristics such as dose and focus.

The term "optimizing" and "optimization" as used herein refers to or means adjusting a patterning process apparatus, one or more steps of a patterning process, etc. such that results and/or processes of patterning have more desirable characteristics, such as higher accuracy of transfer of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method comprising:
    obtaining a simulation of a contour of a pattern to be formed on a substrate using a patterning process;
    determining, by a hardware computer system, a location of an evaluation point on the simulated contour of the pattern, the location spatially associated with a location of a corresponding evaluation point on a design layout for the pattern; and
    producing, by the hardware computer system, electronic information corresponding to a spatial bearing between the location of the evaluation point on the simulated contour and the location of the corresponding evaluation point on the design layout, wherein the information corresponding to the spatial bearing is configured for determining a location of an evaluation point on a measured image of at least part of the pattern, the evaluation point on the measured image spatially associated with the corresponding evaluation point on the design layout.

2. The method of claim 1, wherein the location of the evaluation point on the simulated contour of the pattern is spatially associated with the location of the corresponding evaluation point on the design layout by the location of the evaluation point on the simulated contour of the pattern being the location on the simulated contour that is the substantially shortest distance between the contour and the location of the corresponding evaluation point on the design layout.

3. The method of claim 1, wherein the information corresponding to the spatial bearing comprises the location of the evaluation point on the simulated contour of the pattern and/or of the corresponding evaluation point on the design layout and a direction between the locations of the evaluation point on the simulated contour of the pattern and the corresponding evaluation point on the design layout.

4. The method of claim 3, wherein the direction comprises an angle or slope.

5. The method of claim 1, wherein the information corresponding to the spatial bearing comprises a location of the evaluation point on the simulated contour of the pattern and of the corresponding evaluation point on the design layout.

6. The method of claim 1, further comprising:
obtaining a measured image of at least part of the pattern formed on a substrate;
determining, based on the spatial bearing information, the location of the evaluation point on the measured image of at least part of the pattern, the evaluation point on the measured image spatially associated with the corresponding evaluation point on the design layout; and
outputting spatial parameter information based on the determined location.

7. The method of claim 6, further comprising determining a distance between the location of the evaluation point on the simulated contour of the pattern and the location of the evaluation point on the measured image of the at least part of the pattern and wherein the spatial parameter information comprises the determined distance.

8. The method of claim 6, further comprising performing a calibration of a mathematical model representing at least part of the patterning process based on the spatial parameter information.

9. The method of claim 1, further comprising performing a computer simulation to produce the simulated contour of the pattern.

10. The method of claim 1, further comprising evaluating the pattern formed on the substrate and controlling the patterning process in accordance with a result of the method.

11. A non-transitory computer program product comprising machine-readable instructions therein, the instructions, upon execution by a processor system, configured to cause the processor system to cause performance of at least:
obtain a simulation of a contour of a pattern to be formed on a substrate using a patterning process;
determine a location of an evaluation point on the simulated contour of the pattern, the location spatially associated with a location of a corresponding evaluation point on a design layout for the pattern; and
produce electronic information corresponding to a spatial bearing between the location of the evaluation point on the simulated contour and the location of the corresponding evaluation point on the design layout, wherein the information corresponding to the spatial bearing is configured for determining a location of an evaluation point on a measured image of at least part of the pattern, the evaluation point on the measured image spatially associated with the corresponding evaluation point on the design layout.

12. An inspection system, comprising:
an inspection apparatus; and
an analysis engine comprising the non-transitory computer program product of claim 11.

13. The system of claim 12, wherein the inspection apparatus comprises an electron beam inspection apparatus.

14. The system of claim 12, further comprising a lithographic apparatus comprising a support structure configured to hold a patterning device to modulate a radiation beam and a projection optical system arranged to project the modulated radiation beam onto a radiation-sensitive substrate.

15. A method comprising:
obtaining electronic information corresponding to a spatial bearing between a location of an evaluation point on a simulated contour of a pattern to be formed on a substrate using a patterning process and a location of a corresponding evaluation point on a design layout for the pattern;
obtaining a measured image of at least part of the pattern;
determining, by a hardware computer system and based on the spatial bearing information, a location of an evaluation point on the measured image of the at least part of the pattern, the evaluation point on the measured image spatially associated with the corresponding evaluation point on the design layout; and
outputting spatial parameter information based on the determined location.

16. The method of claim 15, wherein the location of the evaluation point on the simulated contour of the pattern is the location on the simulated contour that is the substantially shortest distance between the contour and the location of the corresponding evaluation point on the design layout.

17. The method of claim 15, wherein the information corresponding to the spatial bearing comprises the location of the evaluation point on the simulated contour of the pattern and/or of the corresponding evaluation point on the design layout and a direction between the locations of the evaluation point on the simulated contour of the pattern and the corresponding evaluation point on the design layout.

18. The method of claim 15, wherein the information corresponding to the spatial bearing comprises a location of the evaluation point on the simulated contour of the pattern and of the corresponding evaluation point on the design layout.

19. The method of claim 15, wherein the location of the evaluation point on the measured image of the at least part of the pattern is determined for a plurality of different instances of the at least part of the pattern and the spatial parameter information is based on a mathematical combination of the determined locations, or
wherein the measured image of the at least part of the pattern is a combination of images of different instances of the at least part of the pattern.

20. A non-transitory computer program product comprising machine-readable instructions therein, the instructions, upon execution by a processor system, configured to cause the processor system to cause performance of the method of claim 15.

* * * * *

UNITED STATES PATENT AND TRADEMARK OFFICE
CERTIFICATE OF CORRECTION

| | |
|---|---|
| PATENT NO. | : 11,243,473 B2 |
| APPLICATION NO. | : 16/615207 |
| DATED | : February 8, 2022 |
| INVENTOR(S) | : Te-Sheng Wang et al. |

It is certified that error appears in the above-identified patent and that said Letters Patent is hereby corrected as shown below:

On the Title Page

Item [56], delete "CN H0934095, 02/1997" and insert -- JP H0934095, 02/1997 --

Signed and Sealed this
Seventeenth Day of May, 2022

Katherine Kelly Vidal
*Director of the United States Patent and Trademark Office*